(12) United States Patent
Tseng

(10) Patent No.: US 6,297,121 B1
(45) Date of Patent: Oct. 2, 2001

(54) FABRICATION METHOD FOR CAPACITORS IN INTEGRATED CIRCUITS WITH A SELF-ALIGNED CONTACT STRUCTURE

(75) Inventor: Horng-Huei Tseng, Hsin-Chu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/638,299

(22) Filed: Aug. 16, 2000

(51) Int. Cl.⁷ ...................................................... H01L 21/20
(52) U.S. Cl. ............................................. 438/393; 438/250
(58) Field of Search ..................................... 438/250, 251, 438/253, 239, 296, 393, 394, 396, 381

(56) References Cited

U.S. PATENT DOCUMENTS

| | | | |
|---|---|---|---|
| 5,126,280 | * 6/1992 | Chan et al. | 438/398 |
| 5,364,809 | * 11/1994 | Kwon et al. | 438/948 |
| 5,438,011 | * 8/1995 | Blalock et al. | 438/396 |
| 5,821,139 | * 10/1998 | Tseng | 438/239 |
| 5,989,953 | * 11/1999 | Liang et al. | 438/253 |
| 6,049,101 | * 4/2000 | Graettinger et al. | 257/296 |

* cited by examiner

Primary Examiner—David Nelms
Assistant Examiner—David Nhu
(74) Attorney, Agent, or Firm—George O. Saile; Stephen B. Ackerman; Larry J. Prescott

(57) ABSTRACT

A method of forming a capacitor for use in high density DRAM circuits is described. A layer of silicon dioxide over an integrated circuit wafer having devices formed therein. A contact hole, which is larger at the top of the contact hole than at the bottom of the contact hole, is formed in the layer of silicon dioxide. A layer of polysilicon is then formed on the sidewalls and bottom of the contact hole. Silicon dioxide spacers are then formed on the polysilicon formed on the sidewalls of the contact hole so that a center cavity remains in the contact hole. The center cavity is then filled with polysilicon to form a center pillar which makes electrical contact with the polysilicon at the bottom of the contact hole. The silicon dioxide spacers are then etched away. A capacitor dielectric layer of silicon dioxide is then deposited on the substrate thereby covering the polysilicon pillar in the contact hole and the polysilicon on the sidewalls and bottom of the contact hole. A layer of polysilicon is then formed on the second layer of silicon dioxide to form the second capacitor plate. In one embodiment a layer of hemispherical grain, HSG, polysilicon is formed on the polysilicon forming the first capacitor plate to increase the capacitance.

20 Claims, 4 Drawing Sheets

FABRICATION METHOD FOR CAPACITORS IN INTEGRATED CIRCUITS WITH A SELF-ALIGNED CONTACT STRUCTURE

BACKGROUND OF THE INVENTION (1) Field of the Invention

This invention relates to methods of fabrication of capacitors in integrated circuits and more particularly for capacitors used in dynamic random access memory circuits.

(2) Description of the Related Art

Capacitors having sufficient capacitance are critical elements in dynamic random access memory, DRAM, circuits. As the size of the DRAM circuits decreases it becomes more difficult to fabricate DRAM capacitors having sufficient capacitance within the space allotted to each DRAM cell.

U.S. Pat. No. 6,049,101 to Graettinger et al. describes methods of forming a DRAM capacitor. A capacitor opening is formed over a substrate node location. Electrically conductive material is formed within the capacitor opening and makes electrical connection with the node location. A structure of conducting material and insulator material is used to form the capacitor.

SUMMARY OF THE INVENTION

It is a primary objective of this invention to provide methods of forming capacitor structures having increased capacitance within an integrated circuit area.

This objective is achieved by forming a first layer of silicon dioxide over an integrated circuit wafer having devices formed therein and a node location. A contact hole is formed in the layer of first layer of silicon dioxide thereby exposing a part of the node location. The contact hole is larger at the top of the contact hole than at the bottom of the contact hole. A self aligned contact is formed in the substrate through the contact hole.

A layer of polysilicon is then formed on the sidewalls and bottom of the contact hole. Silicon dioxide spacers are then formed on the polysilicon formed on the sidewalls of the contact hole so that a center cavity remains in the contact hole. The center cavity is then filled with polysilicon to form a center pillar which makes electrical contact with the polysilicon at the bottom of the contact hole. The silicon dioxide spacers are then etched away using hydrogen fluoride vapor leaving a polysilicon pillar in the contact hole and polysilicon on the sidewalls and bottom of the contact hole. The polysilicon pillar in the contact hole and the polysilicon on the sidewalls and bottom of the contact hole form the first plate of the capacitor.

A second layer of silicon dioxide is then deposited on the substrate thereby covering the polysilicon pillar in the contact hole and the polysilicon on the sidewalls and bottom of the contact hole. A side cavity remains surrounding the polysilicon pillar. A layer of polysilicon is then formed on the second layer of silicon dioxide to form the second capacitor plate. The polysilicon forming the second capacitor plate fills the side cavity.

In one embodiment a layer of hemispherical grain, HSG, polysilicon is formed on the polysilicon forming the first capacitor plate before the second layer of silicon dioxide is deposited. The HSG polysilicon will increase the capacitance of the capacitor.

DESCRIPTION OF THE PREFERRED EMBODIMENTS

Figure 1:
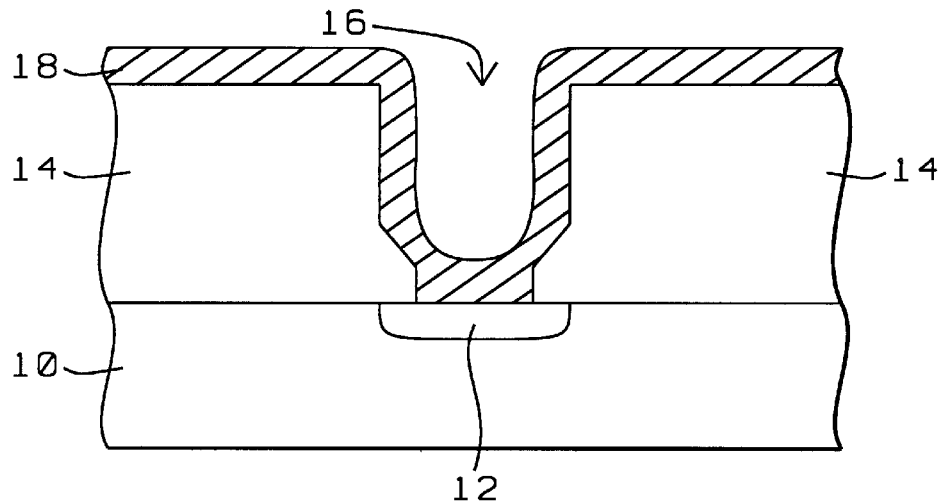
FIG. 1 shows a cross section of a semiconductor substrate segment showing a contact hole formed in a first layer of dielectric and a first layer of conducting material formed on the substrate segment.

Refer now to FIGS. 1–8 for a description of a preferred embodiment of the method of forming a capacitor of this invention. FIG. 1 shows a cross section view of a segment of a semiconductor substrate 10 having devices formed therein, not shown. Typically, but not necessarily, the devices form a dynamic random access memory, DRAM, circuit. A layer of first dielectric 14, such as silicon dioxide or other appropriate dielectric material, is formed on the semiconductor substrate 10 using standard deposition techniques. The layer of first dielectric has a thickness of between about 2000 and 12,000 Angstroms. A contact hole 16 is formed in the layer of first dielectric 14 using standard etching techniques. As shown in FIG. 1, the contact hole is larger at the top of the contact hole than at the bottom of the contact hole. Typically the diameter of the bottom of the contact hole is between about 300 and 3000 Angstroms. The contact hole 16 exposes a region 12 of the semiconductor substrate 10. The contact region 12 is shown as a single region of the substrate however it can be part of a source or drain of a MOSFET structure or other appropriate part of the substrate.

Figure 2:
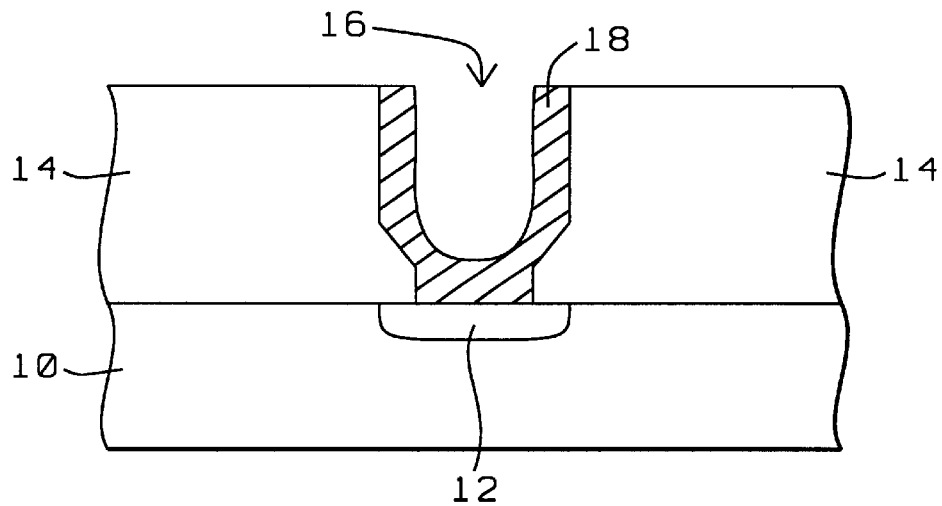
FIG. 2 shows a cross section of the substrate segment after the first conducting material has been removed from the top of the first layer of dielectric.

Next, as shown in FIG. 1, a layer of first conducting material 18, such as doped or undoped polysilicon, is formed on the substrate covering the sidewalls and the bottom of the contact hole 16 using a deposition method such as low pressure chemical vapor deposition. The layer of first conducting material 18 has a thickness of between about 150 and 3000 Angstroms. Next, as shown in FIG. 2, that part of the first conducting material 18 above the top surface of the layer of first dielectric 14 is removed using a method such as chemical mechanical polishing, thereby leaving first conducting material on the sidewalls and bottom of the contact hole 16.

Figure 3:
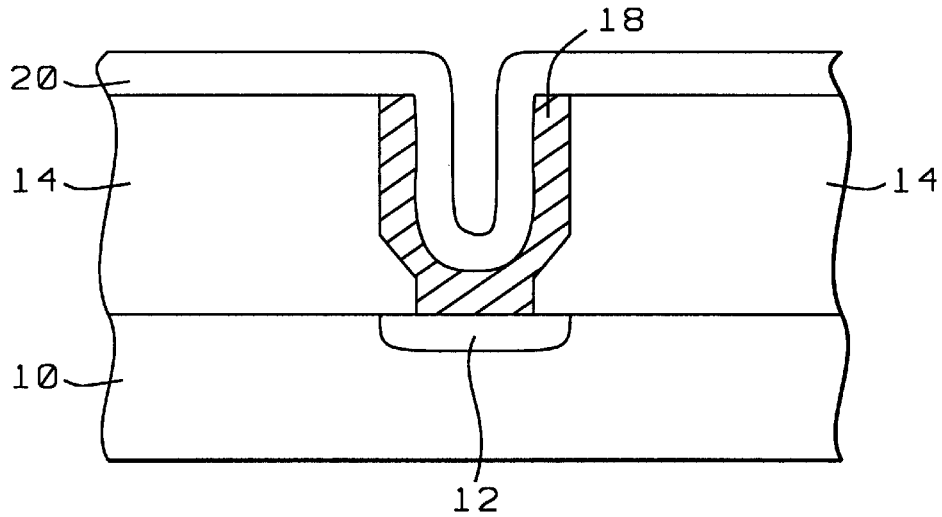
FIG. 3 shows a cross section of the substrate segment after a second layer of dielectric has been deposited leaving a center cavity in the contact hole.
Figure 4:
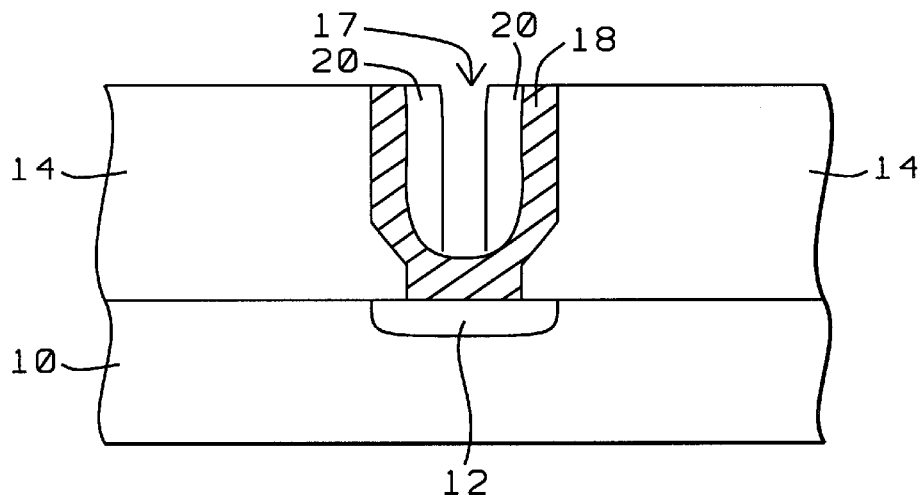
FIG. 4 shows a cross section of the substrate segment after the second layer of dielectric has been vertically anisotropically etched to form dielectric spacers.

As shown in FIG. 3, a layer of second dielectric 20, such as silicon dioxide or other appropriate dielectric material, is formed on the semiconductor substrate 10 using a method such as low pressure chemical vapor deposition, thereby forming second dielectric 20 on the top of the layer of first dielectric 14 and on first conducting material 18 formed on the sidewalls and bottom of the contact hole 16. As shown in FIG. 4, the layer of second dielectric 20 is then etched using vertical anisotropic etching, thereby leaving second dielectric spacers 20 on the first conducting material 18 formed on the sidewalls of the contact hole. The vertical anisotropic etching may comprise a plasma enhanced anisotropic etch. The vertical anisotropic etching removes the second dielectric material from the top surface of the layer of first dielectric 14 and from the bottom of the contact hole. A center cavity 17 remains in the contact hole.

Figure 5:
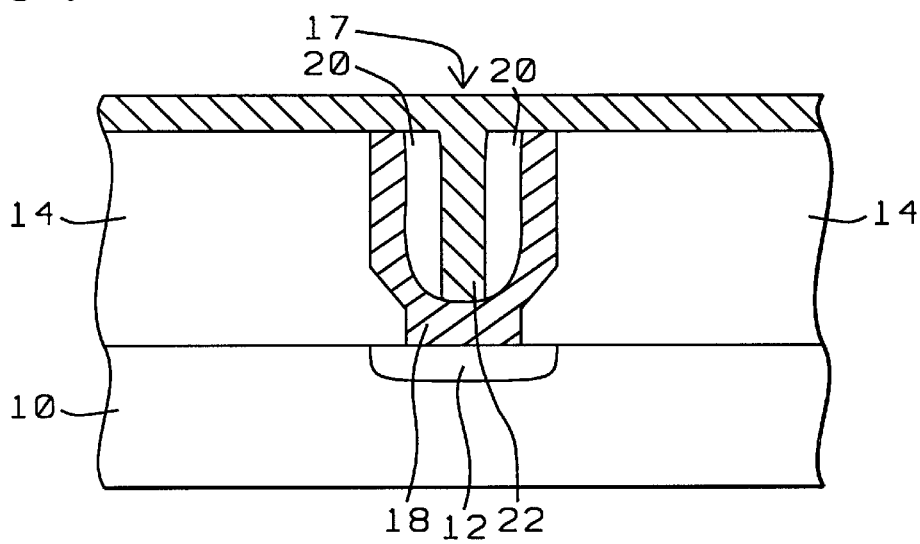
FIG. 5 shows a cross section of the substrate segment after a second layer of conducting material has been deposited, thereby filling the center cavity of the contact hole.
Figure 6:
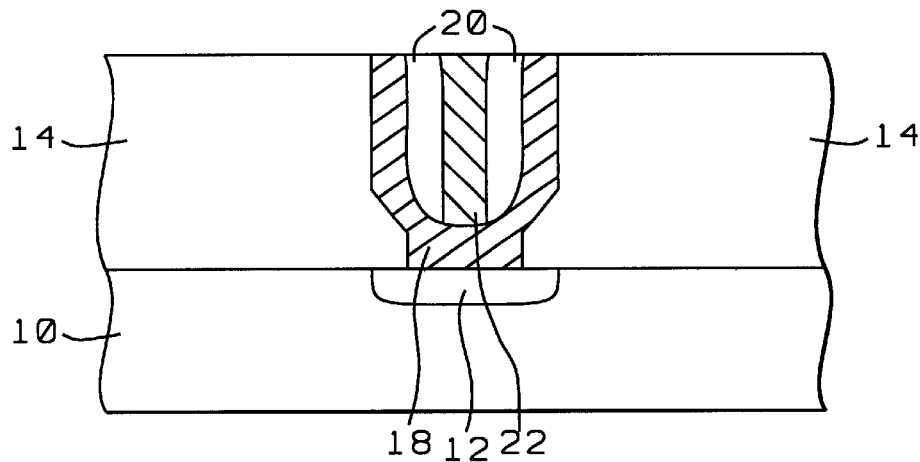
FIG. 6 shows a cross section of the substrate segment after the second conducting material above the top surface of the first dielectric layer has been removed, thereby forming a first capacitor plate of first conducting material on the sidewalls and bottom of the contact hole and a pillar of second conducting material.

As shown in FIG. 5, a layer of second conducting material 22, such as doped or undoped polysilicon, is formed on the substrate, using a deposition method such as low pressure chemical vapor deposition and having sufficient thickness to fill the center cavity 17. As shown in FIG. 5, the second conducting material 22 makes mechanical and electrical contact with the first conducting material 18 at the bottom of the contact hole or at the bottom of the center cavity 17. Next, as shown in FIG. 6, that part of the second conducting material 22 above the top surface of the layer of first dielectric 14 is removed using a method such as chemical mechanical polishing, thereby leaving second conducting material 22 in the center cavity forming a pillar of second conducting material 22.

Figure 7:
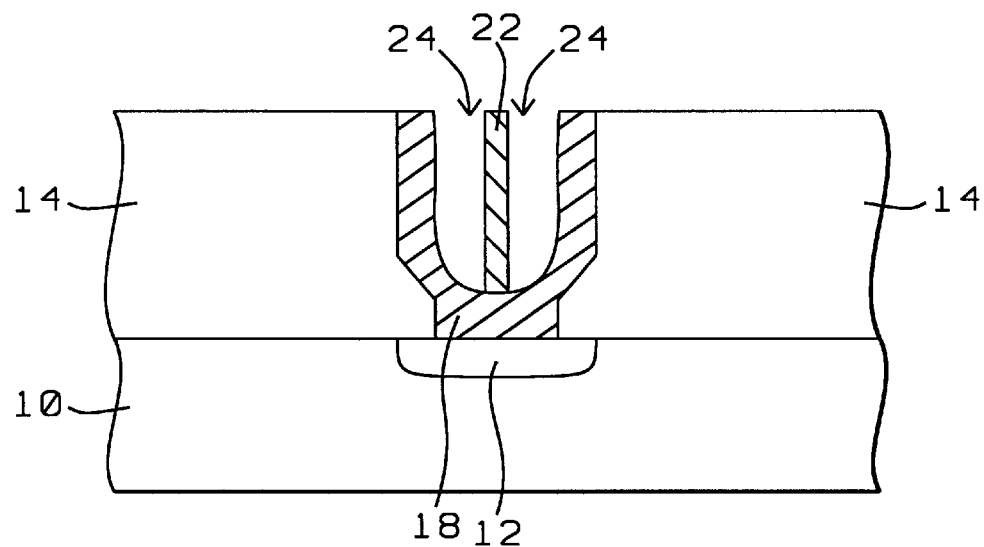
FIG. 7 shows a cross section of the substrate segment after the second dielectric spacers have been etched away.

As shown in FIG. 7, the second dielectric spacers are then etched away using a method such as etching with hydrogen fluoride, HF. This leaves first conducting material 18 on the sidewalls and bottom of the contact hole, a pillar of second conducting material 22 in the center of the contact hole, and side cavities 24 surrounding the pillar of second conducting material 22. As previously indicated, the pillar of second conducting material 22 makes mechanical and electrical contact with the first conducting material 18 on the sidewalls and bottom of the contact hole. The first conducting material 18 on the sidewalls and bottom of the contact hole and the pillar of second conducting material 22 form a first capacitor plate.

Figure 8:
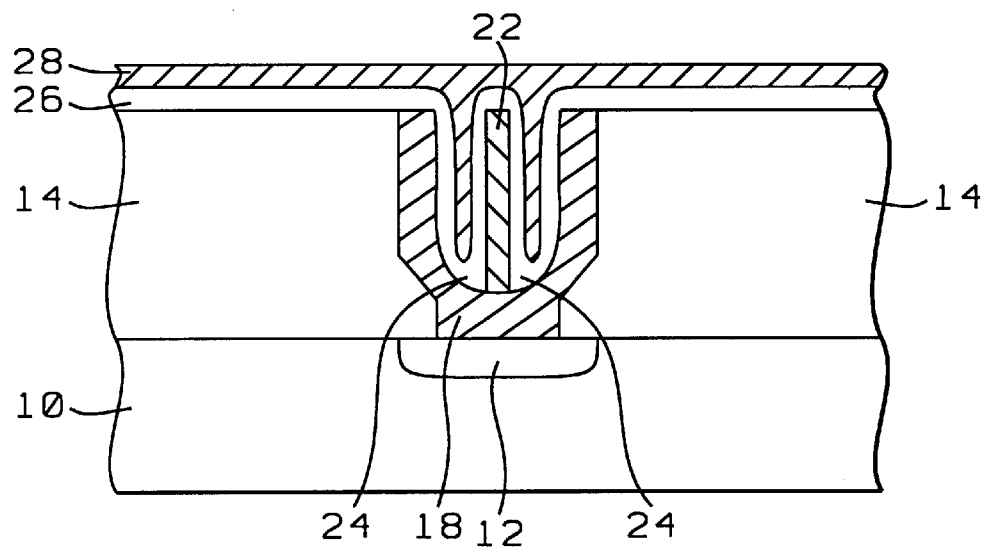
FIG. 8 shows a cross section of the substrate segment after a third layer of dielectric and a layer of third conducting material have been deposited to complete the capacitor.

As shown in FIG. 8, a layer of third dielectric 26, such as silicon dioxide or the like, is formed on the substrate in order to form a capacitor dielectric over the first capacitor plate made up of the first conducting material 18 and second conducting material 22. The layer of third dielectric forms a coating over the first capacitor plate yet does not completely fill the side cavities 24. A layer of third conducting material 28, such as doped or undoped polysilicon deposited using a method such as low pressure chemical vapor deposition, is then formed on the substrate thereby filling the side cavities 24 and forming third conducting material 28 on the top of the layer of third dielectric 26. The layer of third conducting material 28 forms the second, or top, capacitor plate.

Figure 9:
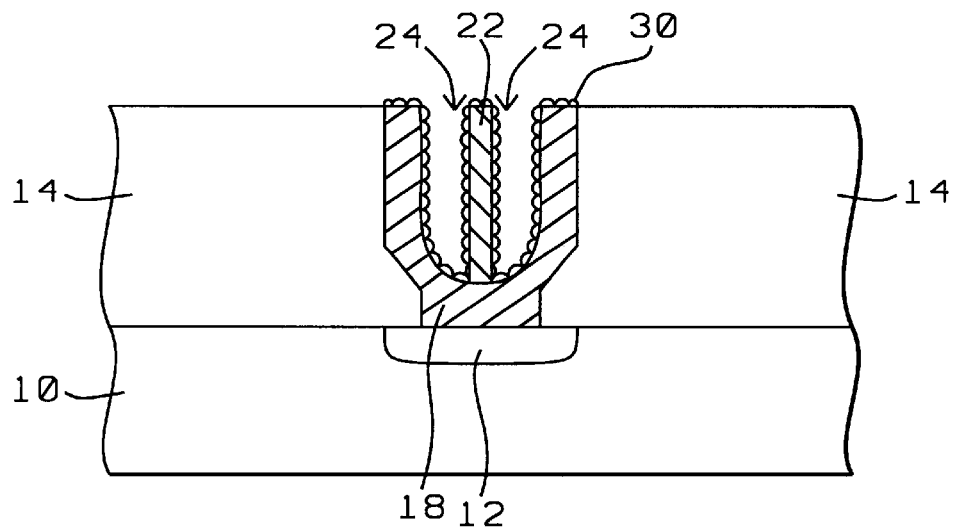
FIG. 9 shows a cross section of the substrate segment after a layer of HSG polysilicon has been deposited after the second dielectric spacers have been etched away.

Another preferred embodiment of this invention is shown in FIGS. 1–7, 9, and 10. In this embodiment the first and second conducting material must be doped or undoped polysilicon. The method is exactly as described in the preceding embodiment through the step of etching away the second dielectric spacer, as shown in FIGS. 1–7. As shown in FIG. 9, a layer of hemispherical grain, HSG, polysilicon 30 is then formed on the polysilicon 18 on the sidewalls and bottom of the contact hole and the polysilicon pillar 22.

Figure 10:
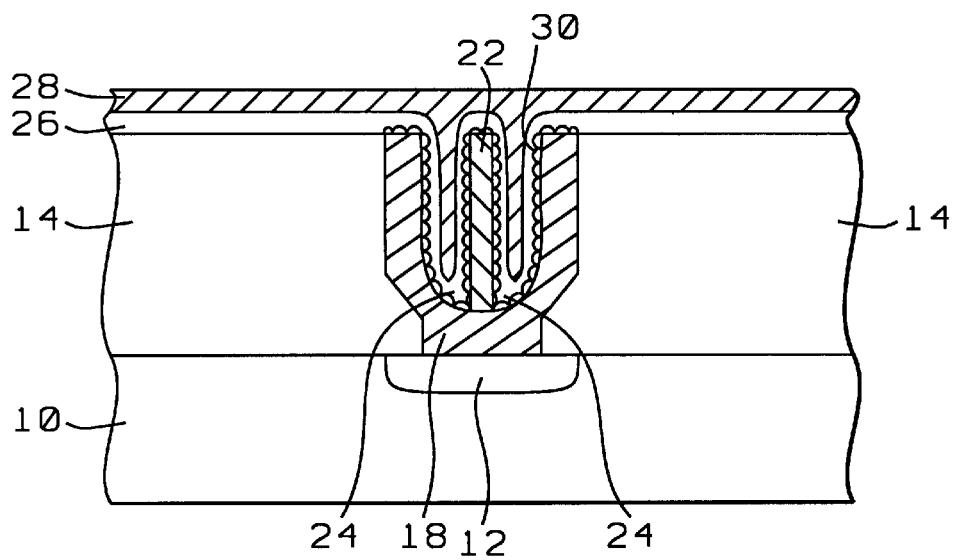
FIG. 10 shows a cross section of the substrate segment after a third layer of dielectric and a layer of third conducting material have been deposited over a first capacitor plate having HSG polysilicon deposited thereon.

As shown in FIG. 10, a layer of third dielectric 26, such as silicon dioxide or the like, is then formed on the substrate in order to form a capacitor dielectric over the first capacitor plate made up of the polysilicon 18 on the sidewalls and bottom of the contact hole, the polysilicon pillar 22, and the layer of hemispherical grain, HSG, polysilicon 30. The layer of third dielectric 26 forms a coating over the first capacitor plate but does not completely fill the side cavities 24. A layer of third conducting material 28, such as doped or undoped polysilicon deposited using a method such as low pressure chemical vapor deposition, is then formed on the substrate thereby filling the side cavities 24 and forming third conducting material 28 on the top of the layer of third dielectric 26. The layer of third conducting material 28 forms the second, or top, capacitor plate.

While the invention has been particularly shown and described with reference to the preferred embodiments thereof, it will be understood by those skilled in the art that various changes in form and details may be made without departing from the spirit and scope of the invention.

What is claimed is:

1. A method of forming a capacitor, comprising:

providing a semiconductor substrate having devices formed therein;

forming a layer of first dielectric on said semiconductor substrate;

forming a contact hole having a bottom, a top, and sidewalls in said layer of first dielectric thereby exposing a contact region in said semiconductor substrate at said bottom of said contact hole, wherein said top of said contact hole is larger than said bottom of said contact hole;

forming a layer of first conducting material on said sidewalls and said bottom of said contact hole;

forming spacers of second dielectric on that part of said layer of first conducting material formed on said sidewalls of said contact hole thereby leaving a center cavity in said contact hole;

filling said center cavity of said contact hole with a second conducting material, thereby forming a center pillar of said second conducting material, and whereby said contact hole is completely filled with said first conducting material, said spacers of second dielectric, and said center pillar of said second conducting material, wherein said center pillar of said second conducting material contacts said first conducting material at said bottom of said contact hole;

removing said spacers of said second dielectric without removing any of said first dielectric;

forming a layer of third dielectric on said semiconductor substrate, thereby covering said conducting material on said sidewalls of said contact hole and said center pillar with said third dielectric and leaving a side cavity surrounding said center pillar; and forming a layer of third conducting material over said layer of third dielectric thereby filling said side cavity with said third conducting material wherein said third conducting material forms a top capacitor plate.

2. The method of claim 1 wherein said forming a layer of first conducting material on said sidewalls and said bottom of said contact hole further comprises:

depositing said first conducting material on said substrate after forming said contact hole in said layer of first dielectric thereby forming said first conducting material on said top of said layer of said first dielectric, said sidewalls of said contact hole, and said bottom of said contact hole; and removing that part of said first conducting material above the top of said layer of first dielectric without removing any of said first conducting material on said sidewalls or said bottom of said contact hole.

3. The method of claim 2 wherein said removing that part of said first conducting material above the top of said layer of first dielectric without removing any of said first conducting material on said sidewalls or said bottom of said contact hole uses chemical mechanical polishing.

4. The method of claim 1 wherein said first conducting material, said second conducting material, and said third conducting material are polysilicon.

5. The method of claim 1 wherein said first dielectric, said second dielectric, and said third dielectric are silicon dioxide.

6. The method of claim 1 wherein said forming spacers of second dielectric on that part of said layer of first conducting material formed on said sidewalls of said contact hole further comprises:

forming a layer of said second dielectric on said substrate after forming said contact hole in said layer of said first dielectric, thereby forming second dielectric on the top of said layer of said first dielectric, said sidewalls of said contact hole, and said bottom of said contact hole; and removing said second dielectric from said top of said layer of said first dielectric and said bottom of said contact hole using vertical anisotropic etching, thereby leaving said second dielectric on said sidewalls of said contact hole.

7. The method of claim 6 wherein said vertical anisotropic etching comprises an anisotropic plasma etch.

8. The method of claim 1 wherein said removing said spacers of said second dielectric comprises etching with hydrogen fluoride vapor.

9. The method of claim 1 wherein said first conducting material and said second conducting material are polysilicon and further comprising:

forming a layer of hemispherical grain polysilicon on said substrate after removing said spacers of said second dielectric thereby forming hemispherical grain polysilicon on the top of said layer of said first dielectric, said first conducting material formed on said sidewalls of said contact hole, and said center pillar of said second conducting material; and removing said hemispherical grain polysilicon from said top of said layer of said first dielectric without removing said hemispherical grain polysilicon from said first conducting material on said sidewalls of said contact hole and said center pillar of said second conducting material.

10. The method of claim 9 wherein said removing said hemispherical grain polysilicon from said top of said layer of said first dielectric without removing said hemispherical grain polysilicon from said first conducting material on said sidewalls of said contact hole and said center pillar of said second conducting material uses chemical mechanical polishing.

11. The method of claim 1 wherein said devices formed in said semiconductor substrate form dynamic random access memory circuits.

12. A method of forming a capacitor, comprising:

providing a semiconductor substrate having devices formed therein;

forming a layer of first dielectric having a top and a bottom on said semiconductor substrate, wherein said bottom of said layer of first dielectric contacts said semiconductor substrate;

forming a contact hole having a bottom, a top, and sidewalls in said layer of first dielectric thereby exposing a contact region in said semiconductor substrate at said bottom of said contact hole, wherein said top of said contact hole is larger than said bottom of said contact hole;

forming a layer of first conducting material on said top of said layer of first dielectric, said sidewalls of said contact hole, and said bottom of said contact hole;

removing that part of said layer of first conducting material from said top of said layer of first dielectric and leaving said layer of first conducting material on said sidewalls and said bottom of said contact hole;

forming a layer of second dielectric on said top of said layer of first dielectric and that part of said layer of first conducting material on said sidewalls and said bottom of said contact hole;

etching away said second dielectric from said top of said layer of first dielectric and said bottom of said contact hole using vertical anisotropic etching, thereby forming second dielectric spacers on that part of said first conducting material formed on said sidewalls of said contact hole and leaving a center cavity in said contact hole;

filling said center cavity of said contact hole with a second conducting material thereby forming a center pillar of said second conducting material, whereby said contact hole is completely filled with said first conducting material, said second dielectric spacers, and said center pillar of said second conducting material, wherein said center pillar of said second conducting material contacts said first conducting material at said bottom of said contact hole;

etching away said second dielectric spacers without removing any of said first dielectric;

forming a layer of third dielectric on said top of said layer of first dielectric, said first conducting material formed on said sidewalls and said bottom of said contact hole, and said center pillar of said second conducting material thereby leaving a side cavity surrounding said center pillar; and forming a layer of third conducting material over said layer of third dielectric thereby filling said side cavity with said third conducting material wherein said third conducting material forms a top capacitor plate.

13. The method of claim 12 wherein said removing that part of said layer of first conducting material from said top of said layer of first dielectric and leaving said layer of first conducting material on said sidewalls and said bottom of said contact hole uses chemical mechanical polishing.

14. The method of claim 12 wherein said first conducting material, said second conducting material, and said third conducting material are polysilicon.

15. The method of claim 12 wherein said first dielectric, said second dielectric, and said third dielectric are silicon dioxide.

16. The method of claim 12 wherein said vertical anisotropic etching comprises an anisotropic plasma etch.

17. The method of claim 12 wherein said etching away said second dielectric spacers comprises etching with hydrogen fluoride vapor.

18. The method of claim 12 wherein said first conducting material and said second conducting material are polysilicon and further comprising:
   forming a layer of hemispherical grain polysilicon on said substrate after etching away said second dielectric spacers thereby forming hemispherical grain polysilicon on the top of said layer of said first dielectric, said first conducting material formed on said sidewalls of said contact hole, and said center pillar of said second conducting material; and
   removing said hemispherical grain polysilicon from said top of said layer of said first dielectric without removing said hemispherical grain polysilicon from first conducting material on said sidewalls of said contact hole and said center pillar of said second conducting material.

19. The method of claim 18 wherein said removing said hemispherical grain polysilicon from said top of said layer of said first dielectric without removing said hemispherical grain polysilicon from said first conducting material on said sidewalls of said contact hole and said center pillar of said second conducting material uses chemical mechanical polishing.

20. The method of claim 12 wherein said devices formed in said semiconductor substrate form dynamic random access memory circuits.

* * * * *